United States Patent [19]

Puri et al.

[11] Patent Number: 4,477,902
[45] Date of Patent: Oct. 16, 1984

[54] TESTING METHOD FOR ASSURING AC PERFORMANCE OF HIGH PERFORMANCE RANDOM LOGIC DESIGNS USING LOW SPEED TESTER

[75] Inventors: Prem Puri, Manassas; Yogi K. Puri, Vienna, both of Va.

[73] Assignee: IBM Corporation, Armonk, N.Y.

[21] Appl. No.: 389,820

[22] Filed: Jun. 18, 1982

[51] Int. Cl.³ .................... G06F 11/00; G01R 31/28
[52] U.S. Cl. ................................. 371/25; 324/73 R
[58] Field of Search ............... 371/25, 15; 324/73 R, 324/73 AT

[56] References Cited

U.S. PATENT DOCUMENTS

| | | | |
|---|---|---|---|
| 3,107,329 | 8/1960 | McSkimin | 324/58 |
| 3,333,187 | 3/1964 | Whitfield | 324/68 |
| 3,675,127 | 7/1972 | McKiernan | 324/186 |
| 3,725,785 | 4/1973 | Barrot et al. | 324/188 |
| 3,761,695 | 9/1973 | Eichelberger | 371/25 |
| 3,783,254 | 1/1974 | Eichelberger | 371/25 |
| 3,896,378 | 7/1975 | Bedford | 324/188 |
| 4,063,080 | 12/1977 | Eichelberger et al. | 371/25 |
| 4,074,851 | 2/1978 | Eichelberger et al. | 371/25 |
| 4,097,801 | 6/1978 | Freeman et al. | 324/188 |
| 4,285,059 | 8/1981 | Burlage et al. | 371/25 |
| 4,293,919 | 10/1981 | Dasgupta et al. | 364/716 |
| 4,298,980 | 11/1981 | Hajdu et al. | 371/25 |

OTHER PUBLICATIONS

C. F. Megivern, Digital Delay Technique, IBM Technical Disclosure Bulletin, vol. 21, No. 7, Dec. 1978, pp. 2794-2795.
R. C. Mitchell, Testing Multispeed LSI Chips, IBM Technical Disclosure Bulletin, vol. 20, No. 5, Oct. 1977, pp. 1801-1802.
S. Das Gupta et al., LSI Design, Testing and Interfacing, 1978 IEEE Intl. Solid-State Circuits Conf., Feb. 15-17, 1978, pp. 216, 17.

Primary Examiner—Charles E. Atkinson
Attorney, Agent, or Firm—John E. Hoel

[57] ABSTRACT

A testing technique is disclosed for assuring AC performance of high speed random logic, employing a low speed tester. AC testing on a low speed tester is split into multiple phases. During the first phase, a slack time delta is introduced, which is the time difference between the product cycle time required by the application and the tester cycle time used in the product test. The product is tested with this timing using conventionally generated test patterns. The effect of the slack is then resolved in the subsequent phases of the test. The product is tested again with the same type test patterns as in the first phase, but with redefined strobe times at the staging latches in the circuit. The slack delta is transferred to paths between the consecutive staging latches and the resultant signals arrive and get sampled by the low speed tester as if there were no slack. The principle of the invention can be applied to any logic circuit to be tested, which has two or more staging latches or to logic circuits which have a plurality of N combinatorial logic blocks each separated by respective staging latches from the others.

8 Claims, 10 Drawing Figures

TESTING METHOD FOR ASSURING AC PERFORMANCE OF HIGH PERFORMANCE RANDOM LOGIC DESIGNS USING LOW SPEED TESTER

FIELD OF THE INVENTION

The invention disclosed broadly relates to semiconductor testing and more particularly relates to AC testing of high performance random logic designs.

BACKGROUND OF THE INVENTION

Generally, performance testing of logic or memory circuits embodied in very large scale integrated circuit chips requires testers capable of testing at the circuit's operational speed. To guarantee AC performance at the designed speed for the circuit under test, the tester must be capable of applying functional test patterns and detecting output response using the high speed clock and data rates required by the product application. Thus AC testing of high performance designs generally requires high speed testers. Conventional testers are capable of precisely timing the instant at which test pulses are generated or received for high speed testing. However, conventional testers are limited by the repetition rate at which accesses can be made to their memory which is used for outputting test patterns or storing test results. The typical conventional AC tester is limited by the tester's memory cycle time which prevents the tester from outputting new test words to the device under test or storing the results from the device under test at a higher rate than the tester's memory cycle time. Frequently, however, the device under test has its clock operating at a substantially higher rate than the cycle time of the tester's memory. Thus, complete testing of the high speed device under test is not possible with conventional, slower speed test equipment.

OBJECTS OF THE INVENTION

It is therefore an object of the invention to test high speed logic and memory VLSI devices in an improved manner.

It is still another object of the invention to test high speed VLSI devices with lower speed testers, in an improved manner.

SUMMARY OF THE INVENTION

These and other objects, features and advantages of the invention are accomplished by the test method disclosed herein. A testing technique is disclosed for assuring AC performance of high speed random logic, employing a low speed tester. AC testing on a low speed tester is split into multiple phases. During the first phase, a slack time delta is introduced, which is the time difference between the product cycle time required by the application and the tester cycle time used in the product test. The product is tested with this timing using conventionally generated test patterns. The effect of the slack is then resolved in the subsequent phases of the test. The product is tested again with the same type test patterns as in the first phase, but with redefined strobe times at the staging latches in the circuit. The slack delta is transferred to paths between the consecutive staging latches and the resultant signals arrive and get sampled by the low speed tester as if there were no slack. The principle of the invention can be applied to any logic circuit to be tested, which has two or more staging latches or to logic circuits which have a plurality of N combinatorial logic blocks each separated by respective staging latches from the others.

DESCRIPTION OF THE FIGURES

These and other objects, features and advantages of the invention will be more fully appreciated with reference to the accompanying figures.

DISCUSSION OF THE PREFERRED EMBODIMENT

A testing technique is disclosed for assuring AC performance of high speed random logic, employing a low speed tester. AC testing on a low speed tester is split into multiple phases. During the first phase, a slack time delta is introduced, which is the time difference between the product cycle time required by the application and the tester cycle time used in the product test. The product is tested with this timing using conventionally generated test patterns. The effect of the slack is then resolved in the subsequent phases of the test. The product is tested again with the same type test patterns as in the first phase, but with redefined strobe times at the staging latches in the circuit. The slack delta is transferred to paths between the consecutive staging latches and the resultant signals arrive and get sampled by the low speed tester as if there were no slack.

In general, performance testing of logic or memory products requires testers capable of testing at machine or operational speeds. To guarantee AC performance at machine speed, the tester must be capable of applying functional test patterns, and detecting output responses using the high speed clock and data rates required by the product application. Thus complete AC testing of high performance designs generally requires high speed testers.

A test method is described herein which permits AC performance assurance of high performance random logic designs, using the test capabilities of a low speed logic tester. The test method described herein relates particularly to structured logic designs, for example circuits incorporating level sensitive scan design (LSSD) testing principles, which are synchronous in nature, are based on maximum delays, and have two or more non-overlapping system clocks. LSSD testing techniques are described, for example, in U.S. Pat. Nos. 3,761,695; 3,783,254 and 3,784,907 by E. B. Eichelberger, assigned to the instant assignee.

Figure 1:
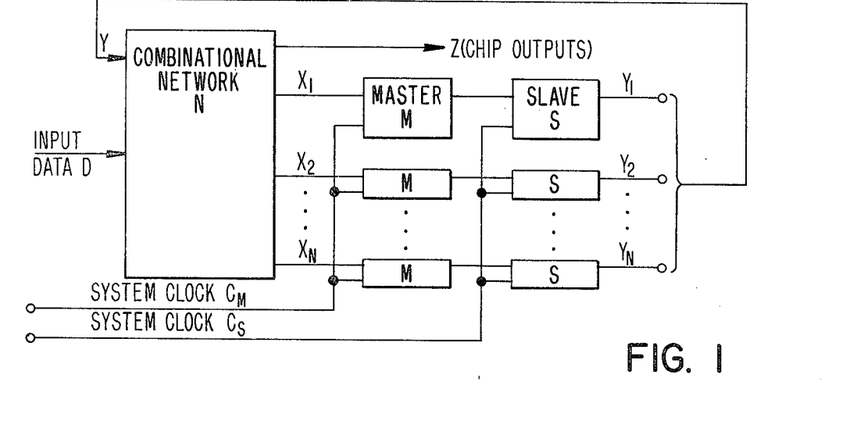
FIG. 1 is a logic block diagram of a master-slave latch design.

As a first illustration of the principles of the invention, consider the master-slave latch design in FIG. 1 where the logic network N is driven by chip input D and outputs Y of feedback latches S. Z represents other chip outputs and $C_M$ and $C_S$ are the non-overlapping system clocks shown in FIG. 2. During $C_M$ time ($T_{MU}+T_{D1}$) in a given cycle, the valid signals at X are latched into master latches M and during $C_S$ time ($T_{SU}+T_{D2}$), the data of M latches are clocked into latches S whose outputs Y along with new data D propagate through N and act as inputs X to latches M being sampled during the subsequent cycle. The data timing, can be inferred from the clock definition in FIG. 2 since its time-coincidence with $C_M$ uptime is sufficient to set latches M before $C_M$ falls. The signal propagation time $T_P$ includes S latch uptime and the delay through network N (with a valid Y and a valid D).

The low speed, AC tester for testing the circuit of FIG. 1, is capable of precisely timing the instant at which test pulses are generated or received for high speed testing. However, the AC tester is limited by the repetition rate at which accesses can be made to its memory for outputting test patterns or storing test results.

In accordance with the invention, AC testing of the high speed logic circuit in FIG. 1 on the low-speed tester is split into two phases, Phase I and Phase II. If the product passes both phases, its AC performance will have been assured.

Phase I Testing

Figure 2:
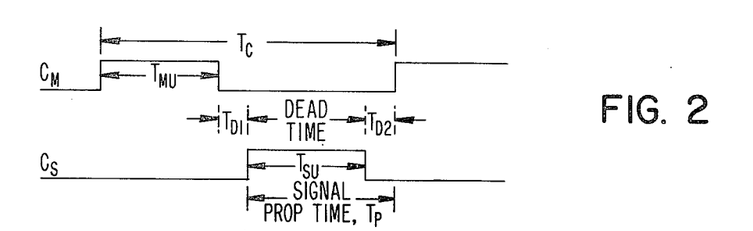
FIG. 2 is a system clock waveform for the circuit of FIG. 1.
Figure 3:
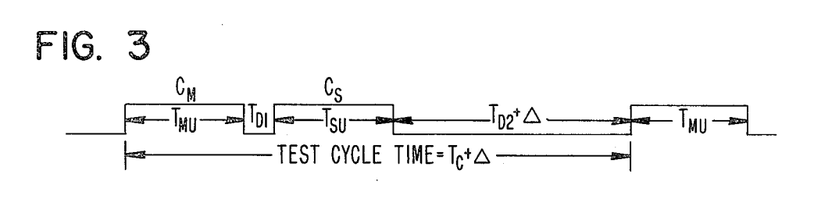
FIG. 3 is the Phase I clock timing waveform for the circuit of FIG. 1.

From FIG. 2, set $T_{MU}$, $T_{D1}$, $T_{SU}$ equal to the minimum durations required by the product specification, making data D valid prior to the rise of $C_M$. Furthermore, set $T_{D2}$ a duration $\Delta$ longer than the product specification so that the cycle time $T_C$ under which the product is tested is also $\Delta$ time too long. This slack time of $\Delta$ is introduced so that a low speed tester can be used. Delta is the time difference between the product cycle time required by the application and the tester cycle time used in the product test. The clock timing in this test would then appear as shown in FIG. 3.

The product is now tested with this timing using conventionally generated test patterns (e.g., stuck fault type and/or functional type). Following the data flow in FIG. 1, in any given cycle all latches M and S will be stressed with minimum pulse widths and all off-chip driver (OCD) outputs arrive at schedule when strobed, however the Y feedback signals have remained valid $\Delta$ time too long relative to the sample time $C_M$. The effect of $\Delta$ on the product operation during this test is to potentially set the latches M in response to minimum $T_{MU}$ alone and not to both a minimum $T_{MU}$ and minimum valid interval for Y jointly, which would be the situation created by $\Delta=0$ of a genuine high performance test. However, in this test, since minimum $T_{MU}$ is followed by minimum $T_{D1}$, which is in turn followed by minimum $T_{SU}$, the M latches provide signals as scheduled when sampled by $C_S$ and subsequently set the S latches. Thus, the M-S paths, and the paths through the OCD outputs are stressed in accordance with the product specification, as if $\Delta$ were equal to zero, which would be the simulation of a high performance test requirement. The effect of the slack time on Y at sample time $C_M$ is now resolved in Phase II of the test.

Phase II Testing

Figure 4:
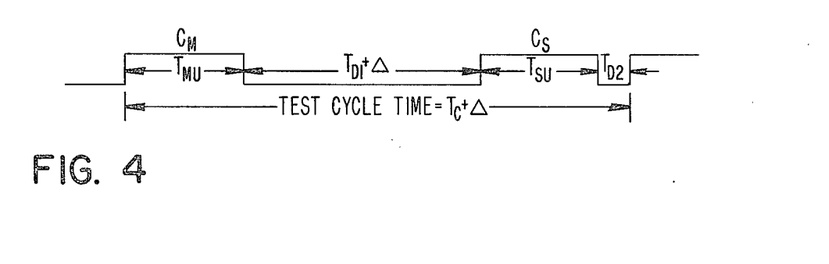
FIG. 4 is the Phase II clock timing waveform for the circuit of FIG. 1.

From FIG. 2, set $T_{MU}$, $T_{SU}$ and $T_{D2}$ equal again to the minimum required by product specification while stretching $T_{D1}$ and thereby forcing $T_C$ to match the tester speed. The data D is made valid prior to the rise of $C_M$. This situation is depicted in FIG. 4. The product is tested again with the same test patterns as in Phase I but with redefined strobe times at the OCD outputs. In this case, following the data flow, the slack $\Delta$ is transferred to paths between the M and S latches, and the Y signals arrive and get sampled at $C_M$ time as if there were no slack. Thus the paths between the network N and the latches M are properly stressed in accordance with the product test specification, thus simulating the requirements of a high performance test. Even though the slack time $\Delta$ in Phase II can improve the apparent performance between latches M and S, this is not considered a problem since all such paths as well as the paths through the OCD outputs have been properly stressed in Phase I.

Thus the Phase II and Phase I testing stages compliment each other such that the deficiency of one is removed by the other. If the product passes both phases of the test, it is considered equivalent to having passed a single test as required on a high performance tester which exhibits $\Delta=0$. If however the product fails in either test, it indicates a deficiency in designed performance (assuming test conditions are properly executed, and the test specifications reflect the product) and not in test conditions, since during each phase, the test conditions are not as stringent as would have been the case if $\Delta=0$ (for a single high performance test).

Thus, the AC testing of the two-clock, high performance random logic circuit of FIG. 1 is achieved in accordance with the invention by two pass testing on a low speed tester, using conventionally generated test patterns.

The next section discusses how the principle of the invention is employed in testing a different class of synchronous design based on two or more non-overlapping system clocks.

Testing Multiple Clock Designs

Figure 5:
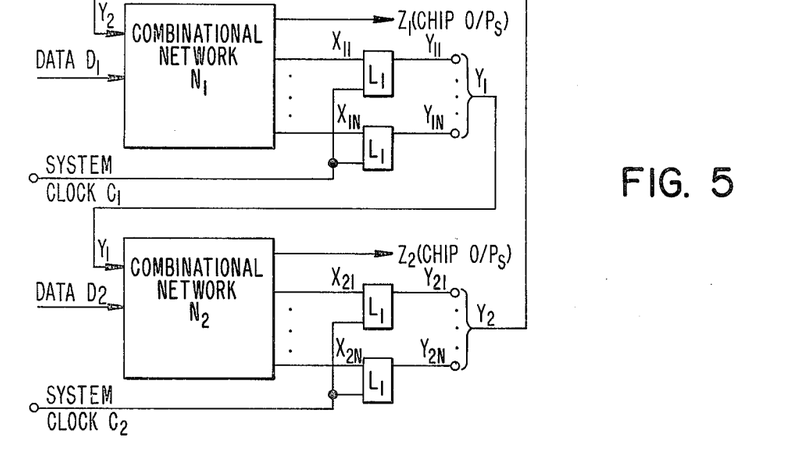
FIG. 5 is a logic diagram of a two clock, single latch design.
Figure 6:
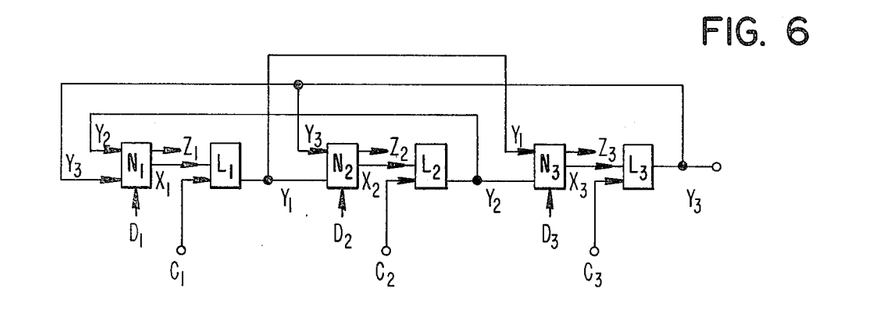
FIG. 6 is a logic block diagram for a three clock, single latch design.

A general example of this class of design using two system clocks and a single latch is shown in FIG. 5. A further generalization is shown in FIG. 6 for a three clock system with its clock timing in FIG. 7. The discussion below shows that test procedures for this three clock design are similar to that described above and are easily extended to an N-clock design. The AC performance testing of the three clock design of FIG. 6 is completed in three phases, designated Phase I, Phase II and Phase III. If the product passes its application test specification in all three phases, its high performance AC design will have been assured.

Figure 8:
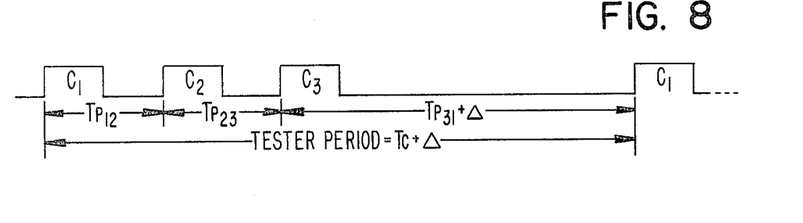
FIG. 8 is the Phase I test timing waveform diagram for the circuit of FIG. 6.

In Phase I, as shown in FIG. 8, $T_{C1U}$, $T_{P12}$, $T_{C2U}$, $T_{P23}$ and $T_{C3U}$ are set to minimum to reflect the product specification, while $T_{P31}$ is stretched to force $T_C$ to match the tester speed. The input data D is made valid at the appropriate times relative to the clock edges. The system clock timing diagram for these setup times is shown in FIG. 8. A careful observation of the data flow in FIG. 6 shows that when the FIG. 8 timing is applied to the product under test, although all latches in any given cycle are stressed with minimum pulse widths in accordance with the product's test specification, the feedback inputs $Y_2$ and $Y_3$ of the network $N_1$ are held valid for an interval which is made longer by the tester slack time $\Delta$. Also, the $Y_3$ input of the network $N_2$ is held valid for an interval which is made longer by the tester slack time $\Delta$. Only the $Y_1$ and $Y_2$ inputs of the network $N_3$ are held valid for their scheduled times. Note that more than the required interval of validity is measured with respect to the sampling system clocks. Also note that in the same given cycle all of the OCDs provide outputs at proper times in response to propagation delays through $N_1$, $N_2$, and $N_3$ which receive their Y inputs at the required times, provided the product is designed to be strobed relative to the $C_3$ clock.

Figure 9:
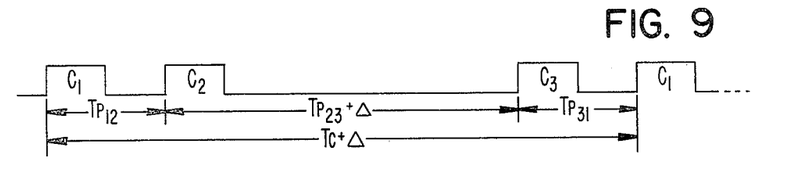
FIG. 9 is the Phase II test timing waveform diagram for the circuit of FIG. 6.
Figure 10:
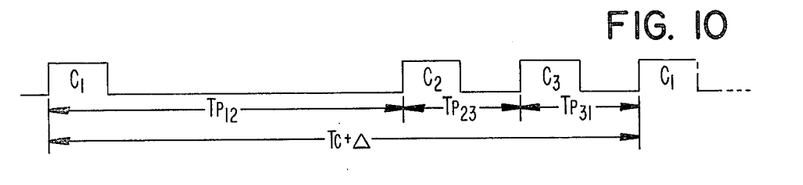
FIG. 10 is the Phase III test timing waveform diagram for the circuit of FIG. 6.

The deficiency in the product test due to the slack time $\Delta$ introduced by the low speed tester in Phase I is resolved in the subsequent test Phases II and III using the timing diagrams shown in FIGS. 9 and 10. Network $N_2$ is tested without slack in Phase II, and network $N_3$ is similarly tested in Phase III. In both of these phases, OCD outputs from the networks result from their Y inputs.

It should be pointed out again that if the product fails in any of the three phases, it would indicate a performance deficiency in the design, assuming the tester functions properly and the test specification reflects the product design. This is so because each of the three testing phases individually does not stress the product as severely as would be the case in a genuine high performance test, due to the slack time $\Delta$ introduced by the low speed tester, in accordance with the invention.

On the other hand, if the product passes the test specification in all three phases, the product would be assured to meet the high performance design requirements, since the high performance mode of testing would have been simulated for the entire design with the three phase technique described above.

The three-clock design of FIG. 6 requires three phases of testing to be complete. Considering the symmetry of the design and the clock arrangement, it can be seen that an N-clock design would require N phases of testing.

Operation of the Invention

Figure 7:
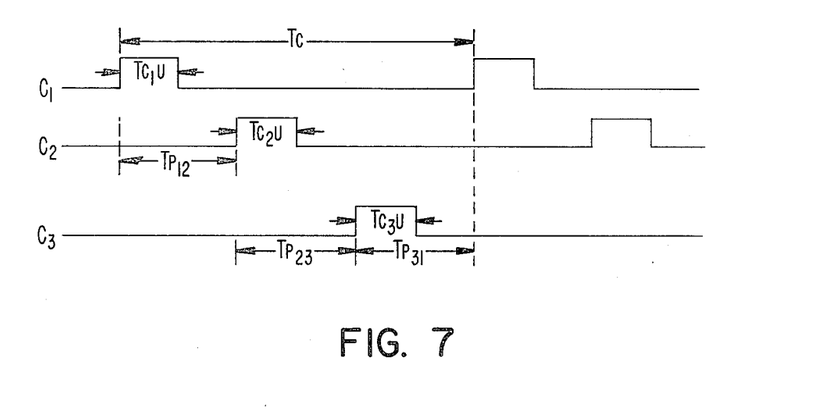
FIG. 7 is a system clock waveform diagram for the circuit of FIG. 6.

The operation of the invention will be illustrated with reference to the three clock, single latch-per-stage circuit shown in FIG. 6, whose system clocking definition is shown in FIG. 7. The circuit consists of a first combinatorial logic block $N_1$ having a data input $D_1$ connected to the output of the tester, and it has a first input $Y_2$ and a second input $Y_3$, for exercising combinatorial logic functions on those inputs and after a delay outputting the logical result $X_1$ to the latch $L_1$. In this example, the delay equals 25 nanoseconds. The latch $L_1$ has an enabling clock input $C_1$ which is turned on for a duration $T_{C1}$ of five nanoseconds, as is shown in FIG. 7. During that five nanosecond interval, the latch $L_1$ will store the logical input $X_1$ and will provide that logic pattern as the output $Y_1$, which will remain valid until the enabling clock $C_1$ has another signal. Other logical outputs may be provided on $Z_1$.

The combinatorial logic block $N_2$ has a data input $D_2$ connected to the output of the tester, and it has the logic inputs $Y_1$ and $Y_3$ which are operated upon by the combinatorial logic functions in the block $N_2$ and after a delay of 25 nanoseconds in this example, the block $N_2$ provides the logical output $X_2$ to the input of the latch $L_2$. Other logical outputs may be provided on the output $Z_2$ to other circuit components. The latch $L_2$ operates in a manner similar to that for the latch $L_1$, and is enabled by the enabling clock signal $C_2$ whose waveform is shown in FIG. 7. The latch $L_2$ has a five nanosecond delay, in this example, during which logical inputs on $X_2$ are stored and made available at the output $Y_2$ of the latch $L_2$ and those outputs will remain valid until another signal $C_2$ occurs. The duration of the waveform $C_2$ is five nanoseconds, as is shown in FIG. 7.

The combinatorial logic block $N_3$ has a data input $D_3$ connected to the output of the tester, and it has logical inputs $Y_1$ and $Y_2$ which are operated upon by the combinatorial logic functions in $N_3$ and after a delay of 25 nanoseconds, $N_3$ outputs a logical output on $X_3$ to the latch $L_3$. Other logical outputs are provided on the output $Z_3$ to other circuit components. The latch $L_3$ is enabled by the enabling clock signal $C_3$ which has a duration of five nanoseconds, as is shown in FIG. 7. During the interval when $C_3$ is on, the latch $L_3$ will store the signal's input at $X_3$ and will output those signals as output $Y_3$, those signals remaining valid until another signal $C_3$ occurs. The output $Y_3$ is connected to the input of the tester which will test the operation of the circuit shown in FIG. 6.

In this example, the circuit shown in FIG. 6 is embodied on a large scale integrated circuit chip which has a characteristic 100 nanosecond cycle time between consecutive logical operations, which can be otherwise characterized as a 10 MHz logic chip. The problem which is addressed by the testing invention disclosed herein, occurs when state-of-the-art circuits such as that shown in FIG. 6, must be tested with logic circuit testing apparatus having memory cycle times which are substantially slower than the cycle time of the circuit under test. In this example, a logic circuit tester apparatus having a memory cycle time of 200 nanoseconds, or which can be otherwise characterized as a five MHz tester, will be the fastest available tester to test the 10 MHz circuit shown in FIG. 6. This circuit testing problem is solved by the invention disclosed herein, as follows.

The circuit of FIG. 6 will be tested in three phases, the waveform diagram for Phase I being shown in FIG. 8, the waveform diagram for Phase II being shown in FIG. 9, and the waveform diagram for Phase III being shown in FIG. 10. During each phase, the circuit of FIG. 6 will be tested for stuck faults and in each respective phase, different portions of the circuit will be tested for speed, with some portions of the circuit being tested twice during the three phases. With the completion of the third and last phase, all components in the circuit of FIG. 6 will have been tested for meeting the 10 MHz speed requirements for which the circuit was designed, using a five MHz tester.

Prior to the first phase of testing, the circuit of FIG. 6 is exercised for several cycles so as to fill the registers and the latches with preliminary test bits which are input at $D_1$, $D_2$ and $D_3$. In Phase I, the waveform diagram of FIG. 8 illustrates the timing of the periodic clocking signals $C_1$, $C_2$ and $C_3$. When clocking signal $C_1$ turns on for its five nanosecond duration, the logical input $X_1$ is made available at the output $Y_1$ to the input of the combinatorial logic block $N_2$, along with the logical input $Y_3$ which was generated during the prior cycle. The 25 nanosecond duration between the end of the $C_1$ waveform and the beginning of the $C_2$ waveform constitutes the 25 nanosecond delay specified for the combinatorial logic block $N_2$. The duration from the beginning of the waveform $C_1$ to the beginning of the waveform $C_2$ is the interval $T_{P12}$ which is specified at 30 nanoseconds, in this example. Then, as is shown in FIG. 8, the waveform for the clock $C_2$ turns on for five nanoseconds transferring the logical input $X_2$ to the output $Y_2$ and the 25 nanosecond duration between the end of the waveform $C_2$ and the beginning of the waveform $C_3$ constitutes the 25 nanosecond specified delay for the combinatorial logic block $N_3$. The duration between the start of the waveform $C_2$ and the start of the waveform $C_3$ is designated $Tp_{23}$ which is 30 nanoseconds, as is shown in FIG. 8. Then, as is shown in FIG. 8, the five nanosecond duration for the clock signal $C_3$ transfers the output $X_3$ from the combinatorial logic block $N_3$ to the output $Y_3$ where it is available for input to the tester. In accordance with the invention, the duration from the beginning of the clock waveform $C_3$ to the the beginning of the next clock waveform $C_1$ is $Tp_{31}$ of 30 nanoseconds plus a $\Delta$ incremental interval of 110 nanoseconds for a total of 140 nanoseconds. Thus, the total duration from the beginning of the waveform $C_1$ to the beginning of the next waveform $C_1$ is made equal to 200 nanoseconds, the cycle time of the tester apparatus which is to test the circuit of FIG. 6. During each periodic, 200 nanosecond cycle, data is input at $D_1$, $D_2$ and $D_3$ from the tester and data is output from $Y_3$, at the tester's slower rate of 5 MHz.

From the above, it can be seen that during Phase I, the latch $L_1$ was tested for its five nanosecond delay, the combinatorial logic block $N_2$ and its $Y_1$ input were tested for their specified delays (the other input $Y_3$ to the combinatorial logic block $N_2$ having been generated during the previous cycle of the circuit). The latch $L_2$ was tested for its five nanosecond delay and the combinatorial logic block $N_3$ and both of its inputs $Y_1$ and $Y_2$ were tested for their specified delays.

It is noted that during Phase I, the latch $L_3$ was not tested, the speed of the feedback paths $Y_2$ and $Y_3$ to the combinatorial logic block $N_1$ were not tested, the logic block $N_1$ itself was not tested, and the speed of the feedback path $Y_3$ to the logic block $N_2$ was not tested. However, all logic paths, all latches, and all combinatorial logic blocks were tested for stuck faults since the validity of the test results output at $Y_3$ to the tester apparatus depends upon the accuracy of the latching, logic, and feedback operations for each respective component in the circuit of FIG. 6.

Phase II of the test is now commenced and it follows the clocking pattern for the clock waveforms $C_1$, $C_2$ and $C_3$ as shown in FIG. 9. The clocking waveform $C_3$ turns on for its five nanosecond duration transferring the logical input $X_3$ to the output $Y_3$ and then after the 25 nanosecond interval between the end of the waveform $C_3$ and the beginning of the next waveform $C_1$, the logical inputs $Y_2$ and $Y_3$ are operated upon by the combinatorial logic block $N_1$, providing the output $X_1$ to the latch $L_1$. The interval between the beginning of the waveform $C_3$ and the beginning of the next waveform $C_1$ is $Tp_{31}$ which is 30 nanoseconds. The waveform $C_1$ then turns on for its five nanosecond duration, transferring the logical input $X_1$ to the output $Y_1$ and, after the 25 nanosecond duration for the operation of the combinatorial logic block $N_1$ on its inputs $Y_1$ and $Y_3$, the output logical value $X_2$ is provided to the latch $L_2$. The duration between the beginning of the waveform $C_1$ and the beginning of the next waveform $C_2$ is $Tp_{12}$ which is 30 nanoseconds. As is shown in FIG. 9, the waveform $C_2$ then begins its five nanosecond duration causing the latch $L_2$ to transfer the logical value $X_2$ to the output $Y_2$. In accordance with the invention, the duration between the beginning of the clock waveform $C_2$ and the beginning of the next clock waveform $C_3$ is $Tp_{23}$ of 30 nanoseconds plus a $\Delta$ incremental value of 110 nanoseconds for a total duration of 140 nanoseconds. It is seen from FIG. 9 that the total duration from the beginning of the clock waveform $C_1$ to the beginning of the next clock waveform $C_1$ is 200 nanoseconds, the cycle time of the testing apparatus. It can also be seen that the duration from the beginning of the waveform $C_3$ to the beginning of the next waveform $C_3$ is also 200 nanoseconds. During each periodic, 200 nanosecond cycle, data is input at $D_1$, $D_2$ and $D_3$ from the tester and data is output from $Y_3$, at the tester's slower rate of 5 MHz.

From the above, it can be seen that the latch $L_3$ has been tested for its five nanosecond delay. The combinatorial logic block $N_1$ and its input $Y_3$ have been tested for their specified delays (the $Y_2$ input to the combinatorial block $N_1$ having been generated from the prior cycle). The latch $L_1$ has been tested for its five nanosecond delay. The combinatorial logic block $N_2$ and both of its inputs $Y_1$ and $Y_3$ have been tested for their specified delays.

It is noted that during Phase II, the latch $L_2$ was not tested, the speed of the feedback path $Y_2$ to the block $N_1$ was not tested, the logic block $N_3$ was not tested, and the speed of the forward path $Y_1$ to the block $N_3$ was not tested. It is further noted, however, that the latch $L_2$ and the logic block $N_3$ were previously tested in Phase I and the speed of the forward path $Y_1$ to the block $N_3$ was tested in Phase I. Indeed the only remaining element of the circuit of FIG. 6 which has not been tested by the end of Phase II is the speed of the feedback path $Y_2$ to the logic block $N_1$.

The testing operation then proceeds to Phase III, with the clocking waveforms for $C_1$, $C_2$, $C_3$ being shown in FIG. 10. The clock waveform $C_2$ turns on for its five nanosecond duration transferring the logical input $X_2$ to the output $Y_2$ and after the 25 nanosecond characteristic delay of the logical block $N_3$, the output $X_3$ is applied to the latch $L_3$. The duration from the beginning of the waveform $C_2$ to the beginning of the next waveform $C_3$ is $Tp_{23}$ which is 30 nanoseconds. Then, the waveform $C_3$ turns on for its five nanosecond duration, transferring the logical input $X_3$ through the latch $L_3$ to the output $Y_3$ and after the characteristic 25 nanosecond delay for the logical block $N_1$, the logical output $X_1$ is applied to the latch $L_1$. The duration from the beginning of the waveform $C_3$ to the beginning of the next waveform $C_1$ is $Tp_{31}$ of 30 nanoseconds. Then, the next waveform $C_1$ turns on for its five nanosecond duration transferring the logical input $X_1$ to the logical output $Y_1$. In accordance with the invention, the duration from the beginning of the waveform $C_1$ to the beginning of the next waveform $C_2$ in FIG. 10 is $Tp_{12}$ of 30 nanoseconds plus the $\Delta$ incremental value of 110 nanoseconds for a total of 140 nanoseconds. The total duration from the beginning of the clock waveform $C_1$ to the beginning of the next clock waveform $C_1$ is 200 nanoseconds, the cycle time of the tester apparatus. It can also be seen that the duration from the beginning of the waveform $C_2$ to the beginning of the next waveform $C_2$ is also 200 nanoseconds. During each periodic, 200 nanosecond cycle, data is input at $D_1$, $D_2$ and $D_3$ from the tester and data is output from $Y_3$, at the tester's slower rate of 5 MHz.

From the above it can be seen that during Phase III, the latch $L_2$ was tested for its five nanosecond interval. The combinatorial logic block $N_3$ and its $Y_2$ input were tested for their specified delays (the logical value of $Y_1$ input to the block $N_3$ having been generated during the prior cycle). The latch $L_3$ was tested for its five nanosecond delay. The combinatorial block $N_1$ and its two inputs $Y_2$ and $Y_3$ were tested for their characteristic delays.

During Phase III, no speed testing was performed on the latch $L_1$ or the logic block $N_2$. And no speed testing was performed on the feedback $Y_3$ to the logic block $N_2$. However, by the end of Phase III, all components in the circuit of FIG. 10 have been tested at least once, with the $Y_2$ input to the logic block $N_3$ being tested during Phase III, not having been previously tested either in Phase I or Phase II.

Thus, at the end of Phase III, the 10 MHz circuit shown in FIG. 6 has been completely tested for its speed of operation by a five MHz testing apparatus, in accordance with the invention. During each cycle, when the $Y_3$ output became valid, it was valid for a 200 nanosecond interval, which was of a sufficient duration to enable the tester apparatus to sample and store the logical output of the circuit for later analysis.

The above example is directed to a three clock, single latch-per-stage circuit, as is shown in FIG. 6 with a specific specification for the latch and combinatorial logic delays and for the cycle time of the tester apparatus. However, the testing invention can be applied to any combinatorial logic circuit having two or more latches therein which can be independently clocked with non-overlapping clock waveforms, and the above example should in no way serve as a limitation upon the wide variety of circuit topologies and timing characteristics which can be tested by relatively slower testing apparatus. Still further, the order of the testing phases can be permuted without changing the character of the invention. For example, the above-described three phase test could also be carried out with the phases having the order 2, 3, 1; or 3, 1, 2; or 3, 2, 1; etc.

The above-described method for testing high performance random logic enables a relatively lower speed tester, such as a 5 MHz tester, to test a relatively higher speed LSI chip, for example a 10 MHz clock rate chip. The relatively low speed limitation in a tester's memory prevents it from outputting new test words to the chip or receiving test results from the chip at a higher rate than its memory cycle time. The integrated circuit chip under test will frequently have a clock rate which is more than twice the cycle time rate for the tester's memory. By employing the above-described method, the slower cycle time tester is able to test a faster cycle time integrated circuit chip. The tester, of course, will have a clock with a very precise strobe timing characteristic, for example a 120 pecosecond precision, and thus it can generate precise strobe pulses at the desired instant of time. However the limitation of all conventional testers is the cycle time duration of its memory which stores the test patterns and the resultant test data. By application of the above-described test method, a slower speed tester can successfully test a faster integrated circuit chip.

Although a specific embodiment of the invention has been disclosed, it will be understood by those of skill in the art that the foregoing and other changes in form and details may be made therein without departing from the spirit and the scope of the invention.

Having thus described our invention, what we claim as new, and desire to secure by Letters Patent is:

1. A method for functionally testing high performance random logic having a first periodic cycle time, with a tester having a second periodic cycle time which is longer than said first cycle time, said random logic including a combinatorial logic network having a testing input connected to the output of said tester and a feedback input, and an output, said random logic further including a master latch having a data input connected to said output of said combinatorial logic network, a first enabling clock input and a data output, said random logic further including a slave latch having a data input connected to said data output of said master latch, a second enabling clock input and a result output connected to the input of said tester and connected to said feedback input of said combinatorial logic network, said first enabling clock input having a first input waveform thereat with a first up level duration which does not overlap with a second up level duration of a second input waveform at said second enabling clock input, the trailing edge of said first waveform preceding the beginning edge of said second waveform by at least a first delay and the trailing edge of said second waveform preceding the beginning edge of said first waveform by at least a second delay, the method comprising the steps of:

increasing the duration between said trailing edge of said second waveform and said beginning edge of said first waveform to be a constant value plus said second delay so that the sum of said first and said second up level durations and said first and said second delays and said constant value are at least as long as said tester periodic cycle time, during a first testing phase;

periodically inputting test data to said testing input of said combinatorial logic network from said tester and periodically outputting test result data from said result output to said tester, with said second periodic cycle time during said first testing phase to test said master latch;

increasing the duration between said trailing edge of said first waveform and said beginning edge of said second waveform to be said constant value plus said first delay, during a second testing phase;

periodically inputting test data to said testing input of said combinatorial logic network from said tester and periodically outputting test result data from said result output to said tester, with said second periodic cycle time during said second testing phase to test said slave latch and said combinatorial logic network;

whereby a tester with a relatively slow cycle time can test high performance random logic with a relatively faster cycle time.

2. A method for functionally testing high performance random logic having a first periodic cycle time, with a tester having a second periodic cycle time which is longer than said first cycle time, said random logic including a combinatorial logic network having a testing input connected to the output of said tester and a feedback input, and an output, said random logic further including a master latch having a data input connected to said output of said combinatorial logic network, a first enabling clock input and a data output, said random logic further including a slave latch having a data input connected to said data output of said master latch, a second enabling clock input and a result output connected to the input of said tester and connected to said feedback input of said combinatorial logic network, said first enabling clock input having a first input waveform thereat with a first up level duration which does not overlap with a second up level duration of a second input waveform at said second enabling clock input, the trailing edge of said first waveform preceding the beginning edge of said second waveform by at least a first delay and the trailing edge of said second waveform preceding the beginning edge of said first waveform by at least a second delay, the method comprising the steps of:

increasing the duration between said trailing edge of said first waveform and said beginning edge of said first waveform to be a constant value plus said first delay so that the sum of said first and said second up level durations and said first and said second delays and said constant value are at least as long as said tester periodic cycle time, during a first testing phase;

periodically inputting test data to said testing input of said combinatorial logic network from said tester and periodically outputting test result data from said result output to said tester, with said second periodic cycle time during said first testing phase to test said slave latch and combinatorial logic network;

increasing the duration between said trailing edge of said second waveform and said beginning edge of said first waveform to be said constant value plus said second delay, during a second testing phase;

periodically inputting test data to said testing input of said combinatorial logic network from said tester and periodically outputting test result data from said result output to said tester, with said second periodic cycle time during said second testing phase to test said master latch;

whereby a tester with a relatively slow cycle time can test high performance random logic with a relatively faster cycle time.

3. A method for functionally testing high performance random logic having a first periodic cycle time, with a tester having a second periodic cycle time which is longer than said first cycle time, said random logic including a first combinatorial logic network having a data input and a testing input connected to the output of said tester, and an output, said random logic further including a first latch having a data input connected to said output of said first combinatorial logic network, a first enabling clock input and a data output, said random logic including a second combinatorial logic network having a data input and an output, said random logic further including a second latch having a data input connected to said output of said second combinatorial logic network, a second enabling clock input and a data output, said random logic including a third combinatorial logic network having a data input and an output, said random logic further including a third latch having a data input connected to said output of said third combinatorial logic network, a third enabling clock input and a result output connected to the input of said tester and connected to said data input of said first combinatorial logic network, said first enabling clock input having a first periodic input waveform thereat with a first up level duration which does not overlap a second up level duration of a second periodic input waveform at said second enabling clock input, the trailing edge of said first waveform preceding the beginning edge of said second waveform by at least a first delay, said second periodic input waveform not overlapping a third up level duration of a third periodic input waveform at said third enabling clock input, the trailing edge of said second waveform preceding the beginning edge of said third waveform by at least a second delay, the trailing edge of said third periodic waveform preceding the beginning edge of said first periodic waveform by at least a third delay, the method comprising the steps of:

increasing the duration between said trailing edge of said third waveform and said beginning edge of said first waveform to be a constant value plus said third delay so that the sum of said first, second and third up level durations and said first, second, and third delays and said constant value are at least as long as said tester periodic cycle time, during a first testing phase;

periodically inputting test data to said testing input of said random logic from said tester and periodically outputting test result data from said result output to said tester, with said second periodic cycle time during said first testing phase to test said first and second latches and said second and third networks;

increasing the duration between said trailing edge of said second waveform and said beginning edge of said third waveform to be said constant value plus said second delay, during a second testing phase;

periodically inputting test data to said testing input of said random logic from said tester and periodically outputting test result data from said result output to said tester, with said second periodic cycle time during said second testing phase to test said first and third latches and said first and second networks;

increasing the duration between said trailing edge of said first waveform and said beginning edge of said second waveform to be said constant value plus said first delay, during a third testing phase;

periodically inputting test data to said testing input of said random logic from said tester and periodically outputting test result data from said result output to said tester, with said second periodic cycle time during said third testing phase to test said second and third latches and said first and third networks;

whereby a tester with a relatively slow cycle time can test high performance random logic with a relatively faster cycle time.

4. A method for functionally testing high performance random logic having a first periodic cycle time, with a tester having a second periodic cycle time which is longer than said first cycle time, said random logic including a first combinatorial logic network having a data input and a testing input connected to the output of said tester, and an output, said random logic further including a first latch having a data input connected to said output of said first combinatorial logic network, a first enabling clock input and a data output, said random logic including a second combinatorial logic network having a data input and an output, said random logic further including a second latch having a data input connected to said output of said second combinatorial logic network, a second enabling clock input and a data output, said random logic including a third combinatorial logic network having a data input and an output, said random logic further including a third latch having a data input connected to said output of said third combinatorial logic network, a third enabling clock input and a result output connected to the input of said tester and connected to said data input of said first combinatorial logic network, said first enabling clock input having a first periodic input waveform thereat with a first up level duration which does not overlap a second up level duration of a second periodic input waveform at said second enabling clock input, the trailing edge of said first waveform preceding the beginning edge of said second waveform by at least a first delay, said second periodic input waveform not overlapping a third up level duration of a third periodic input waveform at said third enabling clock input, the trailing edge of said second waveform preceding the beginning edge of said third waveform by at least a second delay, the trailing edge of said third periodic waveform preceding the beginning edge of said first periodic waveform by at least a third delay, the method comprising the steps of:

increasing the duration between said trailing edge of said second waveform and said beginning edge of said third waveform to be a constant value plus said second delay so that the sum of said first, second and third up level durations and said first, second, and third delays and said constant value are at least as long as said tester periodic cycle time, during a first testing phase;

periodically inputting test data to said testing input of said random logic from said tester and periodically outputting test result data from said result output to said tester, with said second periodic cycle time during said second testing phase to test said first and third latches and said first and second networks;

increasing the duration between said trailing edge of said first waveform and said beginning edge of said second waveform to be said constant value plus said first delay, during a second testing phase;

periodically inputting test data to said testing input of said random logic from said tester and periodically outputting test result data from said result output to said tester, with said second periodic cycle time during said third testing phase to test said second and third latches and said first and third networks;

increasing the duration between said trailing edge of said third waveform and said beginning edge of said first waveform to be said constant value plus said third delay, during a third testing phase;

periodically inputting test data to said testing input of said random logic from said tester and periodically outputting test result data from said result output to said tester, with said second periodic cycle time during said first testing phase to test said first and second latches and said second and third networks;

whereby a tester with a relatively slow cycle time can test high performance random logic with a relatively faster cycle time.

5. A method for functionally testing high performance random logic having a first periodic cycle time, with a tester having a second periodic cycle time which is longer than said first cycle time, said random logic including a first combinatorial logic network having a data input and a testing input connected to the output of said tester, and an output, said random logic further including a first latch having a data input connected to said output of said first combinatorial logic network, a first enabling clock input and a data output, said random logic including a second combinatorial logic network having a data input and an output, said random logic further including a second latch having a data input connected to said output of said second combinatorial logic network, a second enabling clock input and a data output, said random logic including a third combinatorial logic network having a data input and an output, said random logic further including a third latch having a data input connected to said output of said third combinatorial logic network, a third enabling clock input and a result output connected to the input of said tester and connected to said data input of said first combinatorial logic network, said first enabling clock input having a first periodic input waveform thereat with a first up level duration which does not overlap a second up level duration of a second periodic input waveform at said second enabling clock input, the trailing edge of said first waveform preceding the beginning edge of said second waveform by at least a first delay, said second periodic input waveform not overlapping a third up level duration of a third periodic input waveform at said third enabling clock input, the trailing edge of said second waveform preceding the beginning edge of said third waveform by at least a second delay, the trailing edge of said third periodic waveform preceding the beginning edge of said first periodic waveform by at least a third delay, the method comprising the steps of:

increasing the duration between said trailing edge of said first waveform and said beginning edge of said second waveform to be a constant value plus said first delay so that the sum of said first, second and third up level durations and said first, second, and third delays and said constant value are at least as long as said tester periodic cycle time, during a first testing phase;

periodically inputting test data to said testing input of said random logic from said tester and periodically outputting test result data from said result output to said tester, with said second periodic cycle time during said third testing phase to test said second and third latches and said first and third networks;

increasing the duration between said trailing edge of said third waveform and said beginning edge of said first waveform to be said constant value plus said third delay, during a second testing phase;

periodically inputting test data to said testing input of said random logic from said tester and periodically outputting test result data from said result output to said tester, with said second periodic cycle time during said first testing phase to test said first and second latches and said second and third networks;

increasing the duration between said trailing edge of said second waveform and said beginning edge of said third waveform to be said constant value plus said second delay, during a third testing phase;

periodically inputting test data to said testing input of said random logic from said tester and periodically outputting test result data from said result output to said tester, with said second periodic cycle time during said second testing phase to test said first and third latches and said first and second networks;

whereby a tester with a relatively slow cycle time can test high performance random logic with a relatively faster cycle time.

6. A method for functionally testing high performance random logic having a first periodic cycle time, with a tester having a second periodic cycle time which is longer than said first cycle time, said random logic including a first combinatorial logic network having a data input and a testing input connected to the output of said tester, and an output, said random logic further including a first latch having a data input connected to said output of said first combinatorial logic network, a first enabling clock input and a data output, said random logic including a second combinatorial logic network having a data input and an output, said random logic further including a second latch having a data input connected to said output of said second combinatorial logic network, a second enabling clock input and a result output connected to the input of said tester and connected to said data input of said first combinatorial logic network, said first enabling clock input having a first periodic input waveform thereat with a first up level duration which does not overlap a second up level duration of a second periodic input waveform at said second enabling clock input, the trailing edge of said first waveform preceding the beginning edge of said second waveform by at least a first delay, the trailing edge of said second periodic waveform preceding the beginning edge of said first periodic waveform by at least a second delay, the method comprising the steps of:

increasing the duration between said trailing edge of said second waveform and said beginning edge of said first waveform to be a constant value plus said second delay so that the sum of said first and second up level durations and said first and second, delays and said constant value are at least as long as said tester periodic cycle time, during a first testing phase;

periodically inputting test data to said testing input of said random logic from said tester and periodically outputting test result data from said result output to said tester, with said second periodic cycle time during said first testing phase to test said first latch and said second network;

increasing the duration between said trailing edge of said first waveform and said beginning edge of said second waveform to be said constant value plus said first delay, during a second testing phase;

periodically inputting test data to said testing input of said random logic from said tester and periodically outputting test result data from said result output to said tester, with said second periodic cycle time during said second testing phase to test said second latch and said first network;

whereby a tester with a relatively slow cycle time can test high performance random logic with a relatively faster cycle time.

7. A method for functionally testing high performance random logic having a first periodic cycle time, with a tester having a second periodic cycle time which is longer than said first cycle time, said random logic including a first combinatorial logic network having a data input and a testing input connected to the output of said tester, and an output, said random logic further including a first latch having a data input connected to said output of said first combinatorial logic network, a first enabling clock input and a data output, said random logic including a second combinatorial logic network having a data input and an output, said random logic further including a second latch having a data input connected to said output of said second combinatorial logic network, a second enabling clock input and a result output connected to the input of said tester and connected to said data input of said first combinatorial logic network, said first enabling clock input having a first periodic input waveform thereat with a first up level duration which does not overlap a second up level duration of a second periodic input waveform at said second enabling clock input, the trailing edge of said first waveform preceding the beginning edge of said second waveform by at least a first delay, the trailing edge of said second periodic waveform preceding the beginning edge of said first periodic waveform by at least a second delay, the method comprising the steps of:

increasing the duration between said trailing edge of said first waveform and said beginning edge of said second waveform to be a constant value plus said first delay so that the sum of said first and second up level durations and said first and second delays and said constant value are at least as long as said tester periodic cycle time, during a first testing phase;

periodically inputting test data to said testing input of said random logic from said tester and periodically outputting test result data from said result output to said tester, with said second periodic cycle time during said first testing phase to test said second latch and said first network;

increasing the duration between said trailing edge of said second waveform and said beginning edge of said first waveform to be said constant value plus said second delay, during a second testing phase;

periodically inputting test data to said testing input of said random logic from said tester and periodically outputting test result data from said result output to said tester, with said second periodic cycle time during said second testing phase to test said first latch and said second network;

whereby a tester with a relatively slow cycle time can test high performance random logic with a relatively faster cycle time.

8. A method for functionally testing high performance random logic having a first periodic cycle time, with a tester having a second periodic cycle time which is longer than said first cycle time, said random logic including N serially connected combinatorial logic networks, each having a latch at its output, with the last one of said serially connected networks having its output latch as a result output connected to the input of said tester and to the data input of the first one of said serially connected networks, with N periodic enabling clock waveforms having non-overlapping up level durations mutually separated by N respective delays, each of said waveforms applied to the input of a respective one of said latches, with a first one of said combinatorial logic networks having a data input and a testing input connected to the output of said tester, and a result output, said random logic further including a first one of said latches having a data input connected to said output of said first combinatorial logic network, a first one of said enabling clock inputs and a data output, said random logic including a second one of said combinatorial logic networks having a data input and a result output, said random logic further including a second one of said latches having a data input connected to said output of said second combinatorial logic network, a second one of said enabling clock inputs and a data output, said random logic including a third one of said combinatorial logic networks having a data input and a result output, said random logic further including a third one of said latches having a data input connected to said output of said third combinatorial logic network, a third one of said enabling clock inputs and a data output, connected to a next combinatorial logic network, said first enabling clock input having a first periodic input waveform thereat with a first up level duration which does not overlap a second up level duration of a second periodic input waveform at said second enabling clock input, the trailing edge of said first waveform preceding the beginning edge of said second waveform by at least a first delay, said second periodic input waveform not overlapping a third up level duration of a third periodic input waveform at said third enabling clock input, the trailing edge of said second waveform preceding the beginning edge of said third waveform by at least a second delay, the trailing edge of said third periodic waveform preceding the beginning edge of a next periodic waveform by at least a third delay, the method comprising the steps of:

increasing the duration between said trailing edge of said third waveform and said beginning edge of said next waveform to be a constant value plus said third delay so that the sum of said N up level durations for said N waveforms and the sum of said N delays between said N waveforms and said constant value are at least as long as said tester periodic cycle time, during a first testing phase;

periodically inputting test data to said testing input of said random logic from said tester and periodically outputting test result data from said result output to said tester, with said second periodic cycle time during said first testing phase to test said first and second latches and said second and third networks;

increasing the duration between said trailing edge of said second waveform and said beginning edge of said third waveform to be said constant value plus said second delay, during a second testing phase;

periodically inputting test data to said testing input of said random logic from said tester and periodically outputting test result data from said result output to said tester, with said second periodic cycle time during said second testing phase to test said first and third latches and said first and second networks;

increasing the duration between said trailing edge of said first waveform and said beginning edge of said second waveform to be said constant value plus said first delay, during a third testing phase;

periodically inputting test data to said testing input of said random logic from said tester and periodically outputting test result data from said result output to said tester, with said second periodic cycle time during said third testing phase to test said second and third latches and said first and third networks;

continuing the step of increasing and inputting for the N−3 other ones of said N clock waveforms;

whereby a tester with a relatively slow cycle time can test high performance random logic with a relatively faster cycle time.

* * * * *